(12) United States Patent
Xiu

(10) Patent No.: US 9,118,275 B1
(45) Date of Patent: Aug. 25, 2015

(54) CIRCUIT AND METHOD FOR ADAPTIVE CLOCK GENERATION USING DYNAMIC-TIME-AVERAGE-FREQUENCY

(71) Applicant: Liming Xiu, Plano, TX (US)

(72) Inventor: Liming Xiu, Plano, TX (US)

(73) Assignee: Liming Xiu, Plano, TX (US)

( * ) Notice: Subject to any disclaimer, the term of this patent is extended or adjusted under 35 U.S.C. 154(b) by 0 days.

(21) Appl. No.: 14/088,500

(22) Filed: Nov. 25, 2013

(51) Int. Cl.
H03B 21/00 (2006.01)
H03B 21/02 (2006.01)

(52) U.S. Cl.
CPC ..................... H03B 21/02 (2013.01)

(58) Field of Classification Search
USPC ........... 327/105–107, 147–151, 156–159, 83, 327/262, 378, 379, 509, 512, 513; 331/1 A, 331/15, 16, 18, 34, 44, 47, 48, 70; 375/375, 375/376
See application file for complete search history.

(56) References Cited

U.S. PATENT DOCUMENTS 6,329,850 B1 * 12/2001 Mair et al. .................... 327/107
7,372,340 B2 * 5/2008 Xiu et al. ......................... 331/45
8,120,389 B2 * 2/2012 Xiu ............................... 327/105
8,836,392 B2 * 9/2014 Sonntag ......................... 327/158
2010/0315138 A1 * 12/2010 Namba et al. ................. 327/157

OTHER PUBLICATIONS

L. Xiu, "Nanometer Frequency Synthesis beyond the Phase-Locked Loop", Aug. 2012, John Wiley IEEE press, pp. 262-263 and 271-272.*

* cited by examiner

Primary Examiner — Lincoln Donovan
Assistant Examiner — Thomas Skibinski

(57) ABSTRACT

An adaptive clock generation circuit for synthesizing Time-Average-Frequency in dynamic fashion includes (a) a timing circuit for generating a base unit of fixed time span, (b) a control circuit that takes inputs from a microelectronic system wherein the control circuit and the clock generation circuit reside, for generating a update signal and a frequency control word, (c) a direct period synthesizer for generating a plurality of types of pulses by utilizing said base unit and the frequency control word, for creating a segment of a clock pulse train by connecting electrical pulses in series that are selected from said plurality of types according to the update signal, for creating the entire clock pulse train by connecting said segment in series. The resulting Time-Average-Frequency of the clock pulse train matches a selected frequency that is required by the operation of the microelectronic system wherein the clock generation circuit resides. A method of creating such adaptive clock generation circuit is also presented.

10 Claims, 5 Drawing Sheets

CIRCUIT AND METHOD FOR ADAPTIVE CLOCK GENERATION USING DYNAMIC-TIME-AVERAGE-FREQUENCY

TECHNICAL FIELD OF THE INVENTION

The present invention generally relates to the field of clock signal generation on integrated circuit.

DISCUSSION OF THE BACKGROUND

Inside a today's typical VLSI system, there are millions of electrical signals. They make the system perform what it is designed to do. Among those, the most important one is the clock signal. From an operational perspective, clock is the timekeeper of the electrical world inside the chip. From a structural perspective, clock generator is the heart of the chip; clock signal is the blood; and clock distribution network is the vessel.

Timekeeper has played and is playing a critical role in our human life. History shows that the progressive advancement of our civilization is only made possible by the steady refinement of the timekeeper: the clock/watch. The same is true for VLSI system. The purpose of VLSI system is for processing information. The efficiency of performing this task is highly dependent on the time scale used. This time scale is controlled by the clock signal. It has two key aspects: its size (the absolute clock frequency) and its resolution (the capability of differentiating nearby frequencies). In addition, another characteristic is also important: the speed that time scale can be switched from one to another (the speed of clock frequency switching). Phase Locked Loop (PLL) has traditionally been used as on-chip generator of clock signal. It is a beautiful blend of digital and analog circuits in one piece of hardware. From a reference time scale, it can generate other time scales. However, due to its usage of compare-then-correct feedback mechanism, the choice of time scales that can be produced is limited. Equally serious is the problem that the change of time scale (frequency switching in PLL) takes very long time. Although PLL has played a key role that makes today's VLSI system magnificent, these two problems are limiting chip architect's capability for creating further innovation.

The source of the problem originates from the very fact that electrical circuit is not born for handling time, but magnitude (or level). Inside a circuit, information is represented by the medium of electron. It is created on the magnitude of electron flow, using proportional (analog) or binary (digital) relationships. Time is created indirectly through a voltage level crossing a predetermined threshold. Therefore, the task of building a timekeeper inside VLSI system is inherently difficult. In implementation, another fact has made the task of creating time inside circuit even more challenging: since the first day that clock signal is introduced into VLSI design, it is assumed that all the pulses inside a particular clock pulse train have to be equal-in-length, where length is measured in time. This presupposition has limited our options in the creation of timekeeper circuit. Consequently, our current solution is not completely satisfactory: 1) we cannot generate any arbitrary frequency we want. 2) we cannot switch frequency quickly.

Since timekeeper controls VLSI system's operation pace through clock-driving-circuit, a fundamental question can be asked: do all the pulses in a clock pulse train have to be equal-in-length? This question is equivalent to asking: what does clock frequency really mean? In 2008 a novel concept, Time-Average-Frequency, is introduced [1]. It removes the constraint that all pulses, or clock cycles, must be equal-in-length (measured in time). It is based on the understanding that clock frequency is used to indicate the number of operations executed (or events happened) within the time window of one second. As long as the specified number of operations is completed successfully in a specified time window (such as one billion operations within one second for a 1 GHz CPU), the system does not care how each operation is carried out in detail.

Currently when Time-Average-Frequency clock signal is created, its frequency value is fixed and determined by system's operating requirement. In circuit implementation, the Time-Average-Frequency is achieved by utilizing two different types of pulses in an interleaved fashion. The possibility of occurrence of these pulses is calculated beforehand so that the desired Time-Average-Frequency is resulted. This Time-Average-Frequency fulfills the clock rate requirement demanded by system operation. In real applications, however, there are microelectronic systems whose operating rates are not fixed in operation. The rates can be variable due to change in system status and/or disturbance introduced into system. An example is the task of data transfer between a transmitter and a receiver. The transmitter and the receiver can all have their own clock sources. These clock sources are independent of each other. Thus, at any given moment, their frequencies could be slightly different. For this reason, the receiver clock frequency has to be adjusted constantly to match that of transmitter so that a reliable data transfer can be accomplished. In another example, the system operating rate could be affected by environmental condition change, such as the variations on power supply voltage and operating temperature. In this case, the clock frequency also has to be adjusted accordingly.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

It is therefore an object of the present invention to create a clock generation circuit whose output clock frequency can be dynamically adjusted. It is a further object of the present invention to adjust the clock frequency according to the status of system operating condition and system environmental condition so that reliable system operation can be accomplished. In some cases, better performance can be achieved and less resource is required in system and chip level when the present invention is used as the clock driver of the system and chip.

Embodiments of the present invention relate a clock generation circuit for synthesizing Time-Average-Frequency in dynamic fashion includes (a) a base unit of fixed time span, (b) a control circuit that takes inputs from a microelectronic system wherein the control circuit and the clock circuit reside and generates a update signal and a frequency control word, (c) a direct period synthesizer that can generate a plurality of types of pulses by utilizing the said base unit and the frequency control word, that can create a segment of a clock pulse train by connecting electrical pulses in series that are selected from the said plurality of types according to the update signal, that can create the entire clock pulse train by connecting the said segment in series. The resulting Time-Average-Frequency of the clock pulse train matches a selected frequency that is required by the operation of a microelectronic system wherein the clock generation circuit resides.

The present invention relates to circuits and systems that use Time-Average-Frequency and Dynamic-Time-Average-Frequency in their clock signals. Thus, the present invention advantageously utilizes the features of fine frequency resolution and fast frequency switching enabled by Time-Average-Frequency clock generator. This circuit level enabler provides opportunities for innovation in system and architecture levels. This can result in microelectronic system with lower cost and better performance. These and other advantages of the present invention will become readily apparent from the detailed description of various embodiments below.

DETAILED DESCRIPTION

Figure 1:
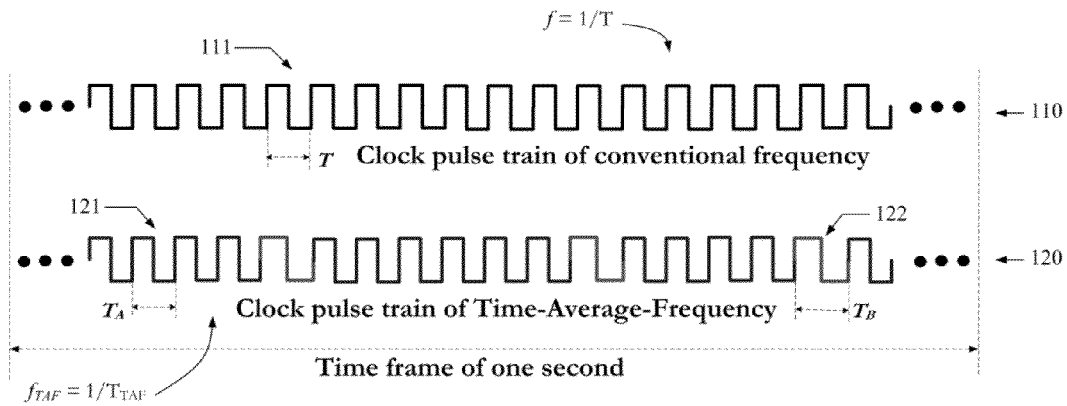
FIG. 1 is a diagram showing a conventional frequency clock signal waveform and a Time-Average-Frequency clock signal waveform.

Reference will now be made in detail to various embodiments of the invention, examples of which are illustrated in the accompanying drawings. While the invention will be described in conjunction with the following embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the arts of VLSI-circuit-and-system design to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or signal processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, flip-flops, other such information storage, transmission or display devices, etc.) into other data similarly represented as physical quantities within other components of the same or a different system or architecture.

Furthermore, for the sake of convenience and simplicity, the terms "clock," "rate," "period," "frequency" and grammatical variations thereof are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (each of which may refer to direct or indirect connections, couplings, and communications), but these terms are also generally given their art-recognized meanings.

Referring now to FIG. 1, a conventional clock signal is shown in waveform 110. It comprises multiple individual electrical pulses. All pulses in conventional clock signal 110 have same length-in-time (implementation imperfection, such as clock jitter, is not included in this discussion). The term length-in-time is defined as length measured in time. One such pulse is labeled as 111. Its length-in-time is T that is defined as clock period. The clock frequency f is defined as its arithmetic inversion and is shown in (1). An example can be provided as following: T=20.04 ns and consequently f=1/T=49.9 MHz. Clock frequency f=49.9 MHz can be interpreted as the fact that there are 49.9 millions electrical pulses existed in a time frame of one second.

$$f = 1/T \tag{1}$$

Referring again to FIG. 1, a Time-Average-Frequency clock signal is shown in waveform 120. It also comprises multiple individual electrical pulses. However, the length-in-times of those pulses can be different. Instead of only one type of pulse, two or more types of pulses can be used. In Time-Average-Frequency clock pulse train shown in FIG. 1, pulse types $T_A$ 121 and $T_B$ 122 are used. The clock period $T_{TAF}$ and Time-Average-Frequency $f_{TAF}$ are defined as in (2) where $0 \leq r \leq 1$ is a fraction number that represents the possibility of $T_A$ 121 and $T_B$ 122 occurrence. For example, two types of pulses $T_A$=20 ns and $T_B$=20.1 ns are used in a Time-Average-Frequency clock signal. If r=0.4, by using (2), $T_{TAF}$=20.04 ns and $f_{TAF}$=49.9 MHz. This example shows that the same 49.9 MHz clock frequency is achieved, but through different method of using two types of pulses. In this example and the previous example both the conventional clock signal and the Time-Average-Frequency clock signal contain 49.9 millions electrical pulses in a time frame of one second. For this reason, they are both qualified as clock frequency of 49.9 MHz. In the construction of Time-Average-Frequency clock signal, there are in general n types of pulses that can be used. Thus, the general form of $T_{TAF}$ and $f_{TAF}$ is given in (3) where $a_i$ is the possibility of occurrence of pulse type $T_i$.

$$T_{TAF}=(1-r)\cdot T_A+r\cdot T_B; f_{TAF}=1/T_{TAF} \quad (2)$$

$$T_{TAF}=a_1\cdot T_1+a_2\cdot T_2+\ldots+a_i\cdot T_i+\ldots+a_n\cdot T_n, \Sigma\{a_i\}=1$$
$$\text{for } i=1 \text{ to } n; f_{TAF}=1/T_{TAF} \quad (3)$$

One of the important techniques of generating conventional clock signal is to use Phase Locked Loop (PLL). From a reference electrical pulse train, the PLL uses compare-then-correct feedback mechanism to construct a new pulse train of different frequency. The key building blocks inside PLL are phase and frequency detector, frequency divider and voltage-controlled oscillator (VCO). The VCO is used to produce a pulse train of certain frequency. Theoretically, when PLL is in lock state, all the pulses in this train will have same length-in-time whose value is determined by the divider used in the loop. The relationship between the reference pulse and the output pulse can be expressed as $T_{ref}=N\cdot T_{out}$ where $T_{ref}$ and $T_{out}$ are the clock periods of reference pulse and output pulse, respectively. N is the dividing ratio. In most implementations, N is an integer. Therefore, the choice of $T_{out}$ is limited. In other words, the available frequencies from a PLL are limited.

Compared to conventional frequency clock signal, Time-Average-Frequency clock signal has the advantage of finer frequency resolution since, instead of using only one type of pulse, several types of pulses can be used. Many more frequencies can be generated from Time-Average-Frequency approach since 1) the sizes of those different types of clock pulses can be adjusted. 2) the possibilities of occurrence of these pulses can be adjusted. Thus more-available-frequencies, or finer frequency resolution, is the first advantage of Time-Average-Frequency clock signal. In circuit implementation, Time-Average-Frequency clock pulse train can be created by directly conjoin the different types of pulses in series. It eliminates the use of compare-then-correct feedback mechanism. This approach results in Time-Average-Frequency clock signal's second advantage of fast frequency switching.

Figure 2:
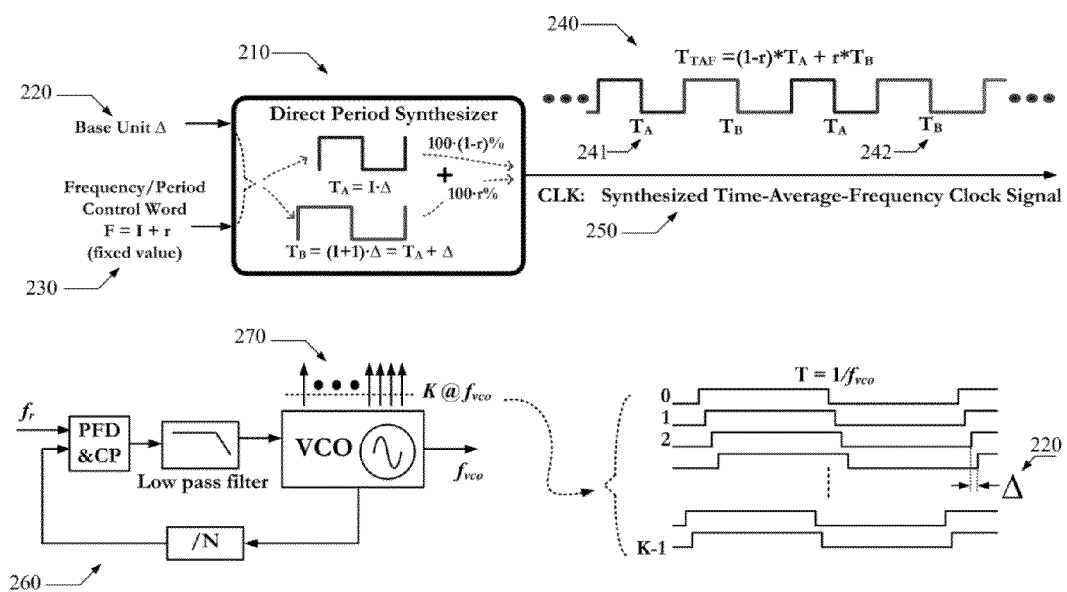
FIG. 2 is an electrical diagram, in block and schematic form, showing a direct period synthesis circuit that produces a Time-Average-Frequency clock signal.

Referring now to FIG. 2, a direct period synthesis circuit for generating Time-Average-Frequency clock signal is shown. A base unit $\Delta$ 220 is generated from a voltage-controlled oscillator (VCO) 270. The VCO is locked to a reference frequency $f_r$ through a PLL 260. When the PLL achieves lock, the VCO frequency $f_{vco}$ and the reference frequency $f_r$ has the relationship of $f_{vco}=N\cdot f_r$, or $T_r=N\cdot T_{VCO}$. The VCO has K output signals. These signals are evenly spaced in time. The time span between any two adjacent such signals is $\Delta=T_{VCO}/K$. From this base unit $\Delta$, direct period synthesizer 210 able to create creates two different pulse types $T_A=I\cdot\Delta$ and $T_B=(I+1)\cdot\Delta$, where I is an integer and it is the integer part of a frequency (or period) control word 230 F=I+r. By using $T_A$ 241 and $T_B$ 242, synthesizer 210 creates a clock pulse train 240. In this pulse train, pulse types $T_A$ and $T_B$ are used in an interleaved fashion. The possibility of their occurrences is determined by the fraction r in control word 230. The value of Time-Average-Frequency is calculated by using (2). In applications, I, r and $\Delta$ are fixed and therefore the resulting Time-Average-Frequency clock signal has a fixed frequency.

Figure 3:
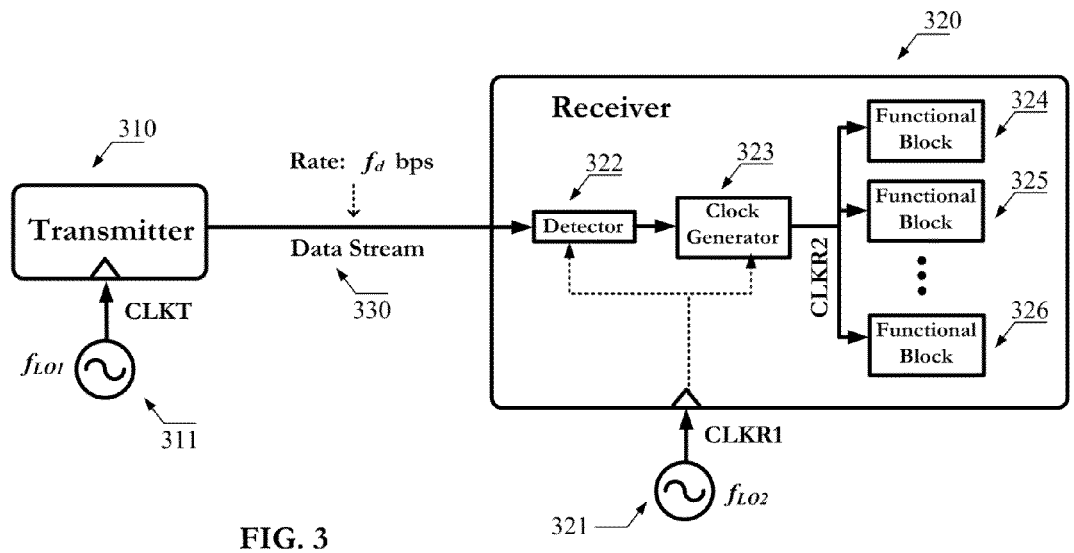
FIG. 3 is an electrical diagram, in block form, showing a transmitter and receiver system where the clock frequency of the receiver needs to be constantly adjusted.

In real world, however, there are microelectronic systems whose operating rates are not fixed, but varied from time to time. Referring now to FIG. 3, an example is provided. In a system that contains a pair of transmitter 310 and receiver 320, both the transmitter and the receiver have their own oscillators as timing reference sources. From oscillator 311 whose oscillating frequency is $f_{LO1}$, a clock signal CLKT is generated. The transmitter 310 uses CLKT (or its frequency multiplier) to deliver a data stream 330 to the receiver 320. This data stream 330 has a bit rate of $f_d$ which is related to the rate of CLKT in a known relationship. The $f_d$ is measured in unit of bits-per-second, or bps for short. From oscillator 321 whose oscillating frequency is $f_{LO2}$, a clock signal CLKR1 is generated. Based on CLKR1, the receiver 320 creates another clock signal CLKR2 and uses it to drive functional blocks 324, 325, 326 and etc. CLKR2 is generated from a circuit made of a detector 322 and a clock generator 323. The reference timing source for the detector and the clock generator is CLKR1. The CLKR2 is produced by using information extracted from data stream 330. Due to the fact that oscillator 311 and oscillator 321 are independent of each other, it is expected that the ratio relationship between the rates of CLKT and CLKR1 is not fixed, but varied from time to time. This is because that these oscillators have their own unique operating environments. As a result, the rate of CLKR2 needs to be adjusted constantly in a dynamic fashion. However, over a specified time frame such as one second, the average rate of CLKR2 should match the value of $f_b$. In this example, the output frequency of clock generator 323 is dynamically adjusted to make this happen.

Figure 4:
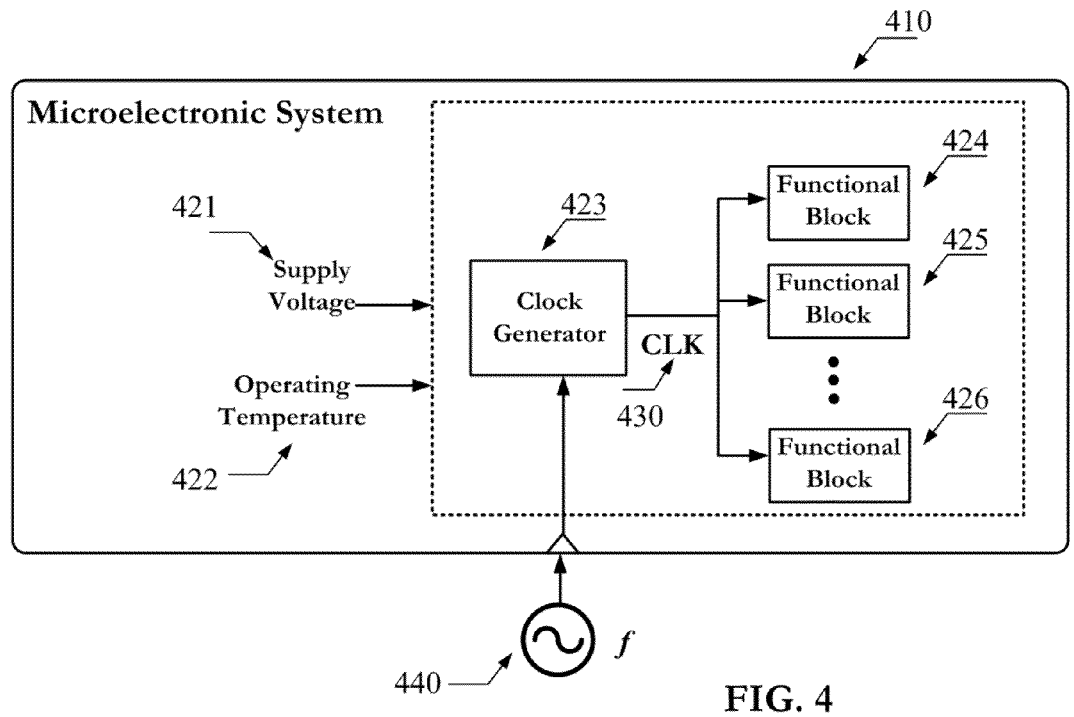
FIG. 4 is an electrical diagram, in block form, showing a microelectronic system whose clock frequency needs to be constantly adjusted due to the variations in environmental condition.

FIG. 4 provides another example of demanding dynamic frequency synthesis. A microelectronic system 410 is designed to perform certain information processing tasks. Its timing reference source is oscillator 440 whose oscillating frequency is f Inside system 410, there is a clock generator 423 and several functional blocks 424, 425, 426 and etc. Clock signal CLK 430 is the output from the clock generator and it is used to drive the functional blocks. All the circuit blocks in this system, including the clock generator and the functional blocks, are supported by power supply provided to system 410. All of them operate in an environment of certain temperature. The operating speed of semiconductor devices, which are the basic building blocks of these circuits, depends on the supply voltage and the surrounding temperature. Consequently, when supply voltage changes or temperature changes, the circuit blocks' operating rate will vary. This can potentially cause system failure. This requires the clock generator to adjust its output clock frequency based on these changes. For one skilled in the art, it can be understood that there are many other systems that require the capability of dynamic frequency synthesis on their clocks.

Exemplary Dynamic-Time-Average-Frequency
Adaptive Clock Generation Circuit

Figure 5:
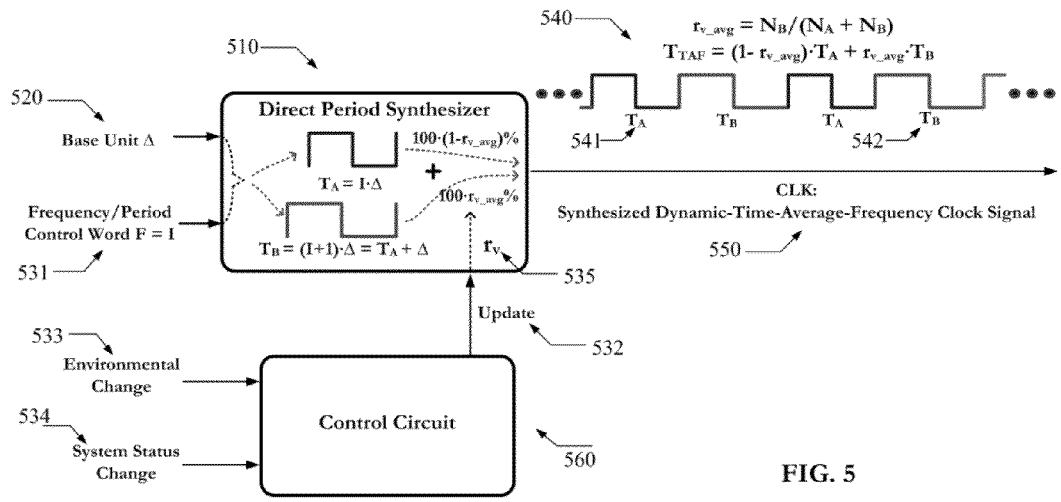
FIG. 5 is an electrical diagram, in block form, showing a direct period synthesis circuit that produces a Dynamic-Time-Average-Frequency clock signal by using two different types of pulses.

Referring now to FIG. 5, an exemplary embodiment of present invention will be described. As shown, a direct period synthesizer 510 is used to create a clock pulse train whose clock rate is dynamically adjusted. A base unit Δ is generated from a timing circuit. The timing circuit could be the PLL 260 in FIG. 2. A delay-locked loop (DLL) can also function as the timing circuit. A frequency control word F 531 is inputted into the synthesizer by upper level system or by user. The value of F is I which is an integer. Two types of pulses $T_A$ 541 and $T_B$ 542 are created by the synthesizer. The length-in-times of $T_A$ and $T_B$ are I·Δ and (I+1)·Δ, respectively. The clock pulse train 540 is created by the synthesizer through the interleaved use of type $T_A$ and $T_B$. A control circuit 560 takes input from signal 533 representing environmental change and signal 534 representing system status change. Its output signal is update 532. At any given moment, the selection of type $T_A$ or $T_B$ is determined by the value of update 532. Compared to the circuit in FIG. 2 wherein frequency control word 230 has both integer and fraction, frequency control word 531 only has integer part. However, a virtual fraction $r_v$ 535 is created by the update 532. Unlike the case in control word 230 where r is fixed, this virtual fraction $r_v$ is not fixed but varied from time to time. When a time frame of one second is selected for observing this clock pulse train, the number of pulses of type $T_A$ that exist in this time frame is recorded as $N_A$; the number of pulses of type $T_B$ that exist in this time frame is recorded as $N_B$. The average value of $r_v$ in this time frame of one second is defined as $T_{v\_avg}=N_B/(N_A+N_B)$. For this type of clock pulse train, the Time-Average-Frequency $f_{TAF}=1/T_{TAF}$ is defined in (4).

$$T_{TAF}=(1-r_{v\_avg})\cdot T_A+r_{v\_avg}\cdot T_B; f_{TAF}=1/T_{TAF} \qquad (4)$$

Figure 6:
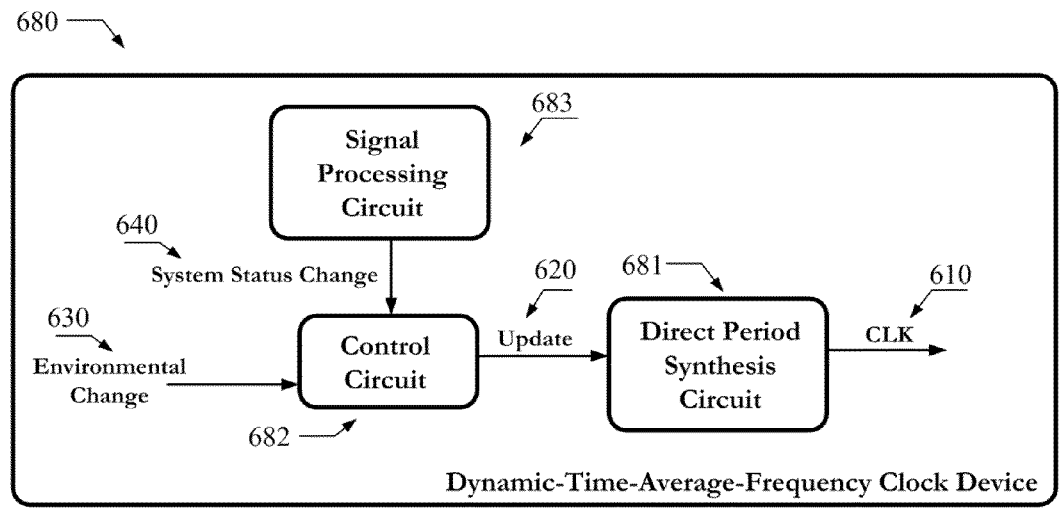
FIG. 6 is an electrical diagram, in block form, showing a Dynamic-Time-Average-Frequency clock device in accordance with a first exemplary embodiment of the present invention.

Referring now to FIG. 6, a microelectronic system 680 is shown which includes a direct period synthesis circuit 681, a control circuit 682 and a signal processing circuit 683. The signal processing circuit 683 generates a signal 640 representing system status change. The control circuit 682 takes signal 640 and signal 630 representing the environmental change and then generates a signal update 620. The direct period synthesis circuit 681 takes the update 620 and creates a Dynamic-Time-Average-Frequency clock pulse train.

Figure 7:
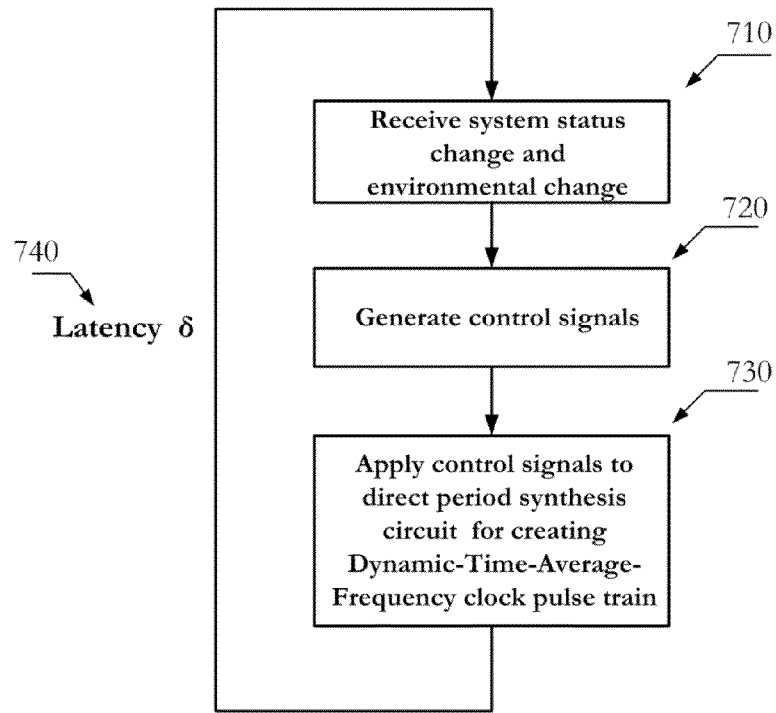
FIG. 7 is a flowchart showing the sequence of actions for generating Dynamic-Time-Average-Frequency.

Referring now to FIG. 7, a flowchart is shown that illustrates the sequence of actions that describes the generation of Dynamic-Time-Average-Frequency clock pulse train. The sequence of actions starts with step 710. A system status change and/or environment change are first received. Step 720 takes this information and generates control signals. The control signals include the update 620 in FIG. 6, and optionally, other signals. In step 730, the control signals are applied to the synthesizer to create the Dynamic-Time-Average-Frequency clock pulse train. After step 730, the action sequence returns back to step 710 and the described process starts again. The time frame required to complete one round of actions from step 710 to step 730 is defined as latency δ 740. Said time frame is referred to as segment. The latency δ 740 is measured in unit of clock cycle. In a time frame represented by latency δ, the clock pulse train comprises some $T_A$ type and some $T_B$ type of pulses. The total number of pulses in this time frame, which is equal to the number clock cycles in this time frame, is the value of latency δ. In some applications, when the design of microelectronic system 680 is completed, the value of latency δ 740 is a fixed number. But the time frame represented by δ, when measured in second, may not be a fixed value. It depends on the numbers of $T_A$ and $T_B$ pulses used in current time frame. For example, assume that δ=5. The time frame represented by δ can be made of two $T_A$ and three $T_B$ pulses. Thus, the time span is (5·I+3)Δ. In another case, The time frame can be made of three $T_A$ and two $T_B$ pulses, resulting in a time span of (5·I+2)Δ. In other applications, the value of latency δ itself could be different for each round of actions.

Figure 8:
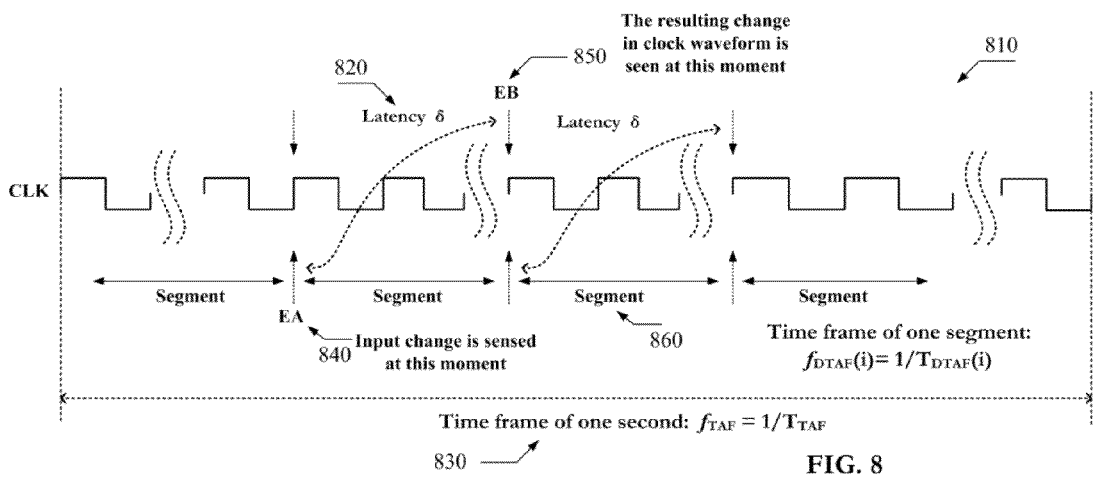
FIG. 8 is a diagram showing a waveform of Dynamic-Time-Average-Frequency.

Referring now to FIG. 8, a waveform of Dynamic-Time-Average-Frequency clock pulse train 810 is shown. It is generated from the microelectronic system 680 of FIG. 6 according to the sequence of actions illustrated in FIG. 7. The entire pulse train is made of segments 860. Each segment occupies time span of latency δ 820. Each segment has a start point and an end point. An exemplary start point EA 840 and its corresponding end point EB 850 are shown. At EA 840, the sequence of actions described in FIG. 7 starts. At EB 850, the current sequence of actions finished and the next sequence of actions starts. For each segment, the virtual fraction $r_v$ introduced in previous discussion is defined as $r_v(i)=n_b/(n_a+n_b)$, where $n_a$ is the number of pulses of type $T_A$ in this segment and $n_b$ is the number of pulses of type $T_B$ in this segment and i is the index of the segment. By this definition, $n_a+n_b=\delta$. This $r_v(i)$ is defined in the time frame of current segment. It can vary from segment to segment. The Dynamic-Time-Average-Frequency $f_{DTAF}(i)=1/T_{DTAF}(i)$ is defined in (5) where i is the index of segment. Dynamic-Time-Average-Frequency is not a fixed value. It can vary from segment to segment.

$$T_{DTAF}(i)=\{1-r_v(i)\}\cdot T_A+r_v(i)\cdot T_B; f_{DTAF}(i)=1/T_{DTAF}(i) \qquad (5)$$

For Dynamic-Time-Average-Frequency clock signal, the Time-Average-Frequency can still be expressed in (4) where $r_{v\_avg}$ is the arithmetic mean of $r_v(i)$ over a time frame of one second. The Dynamic-Time-Average-Frequency is expressed in (5). The relationship between the Dynamic-Time-Average-Frequency and Time-Average-Frequency is described in (6) where q is the number of segments existing in a time frame of one second.

$$T_{TAF}=(1/q)\cdot\Sigma\{T_{DTAF}(i)\}, i\in[1,q]. \qquad (6)$$

Figure 9:
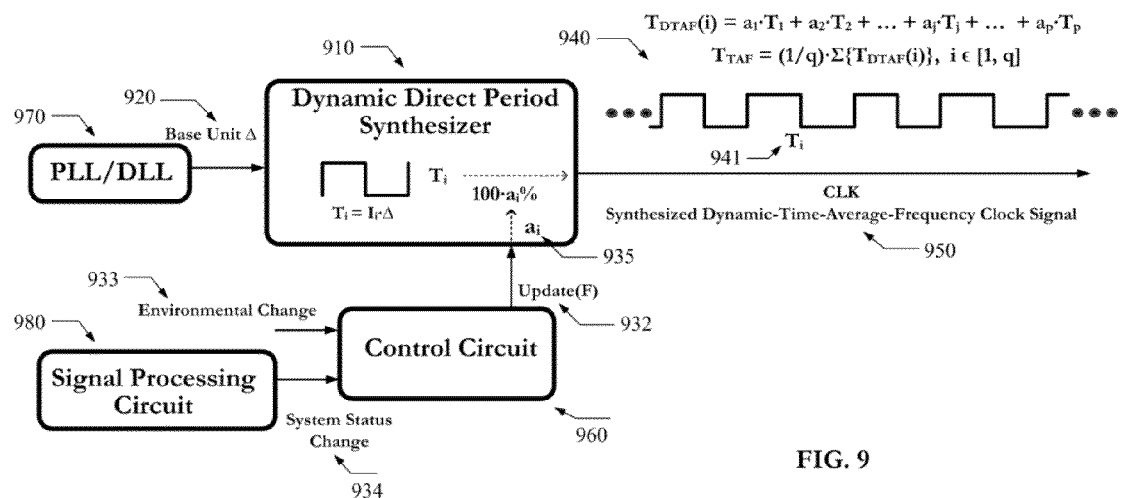
FIG. 9 is an electrical diagram, in block form, showing a direct period synthesis circuit in accordance with a second exemplary embodiment of the present invention that produces a Dynamic-Time-Average-Frequency clock signal.

Referring now to FIG. 9, the preferred embodiment of present invention of synthesizing Dynamic-Time-Average-Frequency clock signal is shown. As shown, a dynamic direct period synthesizer 910 is used to create a clock pulse train whose clock rate is dynamically adjusted. A base unit Δ 920 is generated from a timing circuit. The timing circuit 970 can be a PLL or a DLL that produces a plurality of evenly spaced outputs. The base unit Δ is time span between any two adjacent such outputs. Based on system operating condition, a signal process circuit 980 produces a signal of system status change 934. A control circuit 960 takes inputs from signal 933 representing environmental change and the signal 934. It produces an output signal update (F) 932 that updates the value of frequency control word F. The update (F) 932 is inputted into the dynamic direct period synthesizer 910 to control the pulse length. At any given moment, based on the control word F, the synthesizer creates a pulse of type $T_i=I_i\cdot\Delta$, where $I_i$ is the current value of frequency control word F. And this type of pulse is used to make the pulse train for the current moment. At any given time, the pulse type for use is calculated using the value of control word F; and the moment to update control word F is controlled by the moment that update (F) 932 makes switching.

The Dynamic-Time-Average-Frequency clock pulse train 940 is therefore made of a plurality of types of pulses. The size of each pulse type is determined by the value of control word F. The entire pulse train is made of segments. Each segment has a time frame of latency δ. For each segment, the Dynamic-Time-Average-Frequency is defined as in (7) where p is the total number of types of pulses; $a_j$ is the possibility of pulse type $T_j$ occurrence in the time frame of current segment; i is the index of segment. For this Dynamic-Time-Average- Frequency clock pulse train, the Time-Average-Frequency is defined on (6) where q is the total number of segments in a time frame of one second.

$$T_{DTAF}(i)=a_1 \cdot T_1+a_2 \cdot T_2+\ldots+a_j \cdot T_j+\ldots+a_p \cdot T_p,$$
$$\Sigma\{a_j\}=1 \text{ for } j=1 \text{ to } p; f_{DTAF}(i)=1/T_{DTAF}(i) \qquad (7)$$

The present invention therefore advantageously provides a circuit and system that can synthesis clock frequency in a dynamic way. When it is used in a microelectronic system, present invention can help make the system more cost and energy efficient. It can also help make the system more powerful by providing it with better flexibility in system's architecture creation.

Exemplary Method of Generating Dynamic-Time-Average-Frequency Clock Signal

The present invention further relates to a method of creating Dynamic-Time-Average-Frequency clock signal. The method generally comprises (1) creating a base unit in time; (2) creating a plurality of types of pulses based on the base unit; (3) generating a frequency control word using inputs generated from system operating condition and system environment condition, and use the generated control word to construct the said various pulse types; (4) generating a update signal using inputs generated from system operating condition and system environment condition, and use the generated update signal to control the moment of changing pulse type in the clock pulse train; (5) creating a clock pulse train that is made of segments by connecting segments in series, each segment is made of said multiple types of pulses and is made of a number of pulses by connecting them in series, the type-of-pulse and the moment-of-changing-pulse-type is controlled by the frequency control word and the update signal, respectively.

In one embodiment of the present invention, the base time unit can be generated from a Phase-Looked Loop which is locked to a reference time source. In another embodiment of the present invention, the base time unit can be generated from a Delay-Looked Loop which is locked to a reference time source.

CONCLUSION/SUMMARY

Thus, the present invention provides circuitry and method for clock frequency synthesis using Dynamic-Time-Average-Frequency concept. When it is used as clock generation circuit in a microelectronic system, the present invention improves system performance by dynamically adjust the clock frequency based on system operating condition and system environmental condition. It therefore enables more efficient use of resources. It therefore utilizes power more efficient. It also makes system more reliable since system is equipped with the capability of self-adaptive to its environment. It further enhances system's functionality by providing more options in system architecture creation.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

[1] L. Xiu, "The Concept of Time-Average-Frequency and Mathematical Analysis of Flying-Adder Frequency Synthesis Architecture," IEEE Circuit And System Magazine, 3rd quarter, pp 0.27-51, September 2008.

[2] L. Xiu, "Nanometer Frequency Synthesis beyond Phase Locked Loop," August 2012, John Wiley IEEE press.

[3] L. Xiu and Z. You, "High Speed Precision Frequency and Phase Synthesis," U.S. Pat. No. 6,940,937, December 2005.

What is claimed is:

1. A clock generation device, comprising:
an input for receiving a signal responsive to environmental change;
an output for delivering a clock signal;
a signal processing circuit for generating a signal of system status change, having an output for delivering said signal of system status change, said signal processing circuit generates said signal of system status change based on status change of a microelectronic system driven by said clock generation device;
a control circuit for generating a signal of update (F), having an output for delivering said signal of update (F), having a first input for receiving said signal of system status change, having a second input for receiving said signal responsive to environmental change, said control circuit generates said signal of update (F) based on said signal of system status change and said signal responsive to environmental change;
a base time unit generation circuit for generating a base time unit Δ, having an output for delivering said base time unit Δ;
a dynamic direct period synthesis circuit for generating a Dynamic-Time-Average-Frequency (DTAF) clock signal, having a first input for receiving said base time unit Δ from said base time unit generation circuit, having a second input for receiving said signal of update (F) from said control circuit, having an output for delivering said DTAF clock signal, said DTAF clock signal is a clock pulse train consisting of a plurality of segments, each said segment consists of δ clock cycles where δ is an integer of greater than zero, each said segment of said DTAF clock signal comprises δ electrical pulses, said electrical pulses in each said segment can have different length-in-times, length-in-time of each said electrical pulse is equal to an integer multiple of said base time unit Δ, said integer has a value of greater than one and is determined by said signal of update (F);
wherein said output is connected to the output of said dynamic direct period synthesis circuit.

2. The circuit of claim 1, wherein the base time unit generation circuit, comprising:
a phase-locked loop for generating a plurality of evenly spaced output phases, a said base time unit Δ is time span between any two adjacent said output phases, comprising:
a phase detector having a first input receiving a reference signal and a second input receiving a feedback signal, for producing an error signal at an output corresponding to a phase and frequency difference between the reference and feedback signal;

a filter for low-pass filtering the error signal;
a frequency divider of certain dividing ratio having an input receiving a oscillation clock signal, and an output coupled to the phase detector as the feedback signal;
a voltage-controlled oscillator for generating said plurality of output phases at a frequency selected by the filtered error signal, wherein one of the plurality of output phases is coupled to said input of the frequency divider as said oscillation clock signal.

3. The circuit of claim 1, wherein the base time unit generation circuit, comprising:
a delay locked loop, for generating a plurality of evenly spaced output phases, said base time unit Δ is time span between any two adjacent said output phases, comprising:
a phase detector having a first input receiving said global clock signal and a second input receiving a feedback signal, for producing an error signal at an output corresponding to a phase and frequency difference between said global clock signal and feedback signals;
a filter for low-pass filtering the error signal;
a series of delay stages comprised of identical cells for generating a time delay at a value selected by the filtered error signal, wherein the input of the first cell is connected to said global clock signal, wherein the output of the last cell is coupled to the phase detector as the feedback signal, having an output for delivering said plurality of outputs generated from the outputs of said cells as said plurality of evenly spaced output phases.

4. The circuit of claim 1, wherein each said segment uses a time frame of δ clock cycles that is required to finish a sequence of actions of generating said signal update (F) based on said signal of system status change and said signal responsive to environmental change and applying said signal update (F) to create a pulse train in said segment, said segment has an attribute of arithmetic mean, said arithmetic mean is calculated as dividing said time frame by δ, DTAF of said segment is defined as mathematical inversion of said arithmetic mean.

5. The circuit of claim 1, wherein Time-Average-Frequency of said DTAF clock signal is calculated as arithmetic mean of said DTAF of all segments, said Time-Average-Frequency is equal to a value determined by a defined operation of said microelectronic system, said microelectronic system is driven by said DTAF clock signal from said clock generation device.

6. A method of generating a DTAF clock signal, said DTAF clock signal is a clock pulse train consisting of a plurality of segments, each said segment consists of δ clock cycles where δ is an integer of greater than zero, each said segment of said DTAF clock signal comprises δ electrical pulses, said electrical pulses in each said segment can have different length-in-times, length-in-time of each said electrical pulse is equal to an integer multiple of a base time unit A, said integer has a value of greater than one and is determined by a signal of update (F), comprising the steps of:
creating said base unit time Δ, said time base unit has a fixed value in its time span;
receiving a first control signal responsive to change of environmental condition;
creating a second control signal according to change of system status;
creating said signal of update (F) based on said first and second control signals;
applying said signal of update (F) to create said segment of said DTAF clock pulse train, length-in-times of electrical pulses in said segment are determined by said update (F);
outputting said clock pulse train as said DTAF clock signal.

7. The method of claim 6, further comprising:
creating each said segment by using a time frame that is required to finish a sequence of actions of creating said first, second and said signal of update (F) and applying said signal of update (F) to create a DTAF clock pulse train in said segment, said segment has an attribute of arithmetic mean, said arithmetic mean is calculated as dividing said time frame by δ, DTAF of said segment is defined as mathematical inversion of said arithmetic mean, Time-Average-Frequency of said DTAF clock signal is calculated as arithmetic mean of said DTAF of all segments, said Time-Average-Frequency is equal to a value determined by a defined operation of a microelectronic system, said microelectronic system is driven by said DTAF clock signal.

8. The method of claim 6, further comprising:
creating said base unit time Δ from a plurality of phase-evenly-spaced signals, said base unit time Δ is defined as time span between any two adjacent signals from said plurality of phase-evenly-spaced signals.

9. The method of claim 8, further comprising:
creating said plurality of phase-evenly-spaced signals from a multi-delay-stage Voltage Controlled Oscillator (VCO), said outputs from said delay stages form said plurality of phase-evenly-spaced signals, said VCO is locked to a reference signal through a Phase Locked Loop.

10. The method of claim 8, further comprising:
creating said plurality of phase-evenly-spaced signals from a Voltage Controlled Delay Line (VCDL), said VCDL consists of is a plurality of delay cells, said outputs from said delay cells form said plurality of phase-evenly-spaced signals, said VCDL is locked to a reference signal through a Delay Locked Loop.

* * * * *